(12) United States Patent
Pelley et al.

(10) Patent No.: US 7,777,330 B2
(45) Date of Patent: Aug. 17, 2010

(54) HIGH BANDWIDTH CACHE-TO-PROCESSING UNIT COMMUNICATION IN A MULTIPLE PROCESSOR/CACHE SYSTEM

(75) Inventors: Perry H. Pelley, Austin, TX (US); Michael B. McShane, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 296 days.

(21) Appl. No.: 12/026,325

(22) Filed: Feb. 5, 2008

(65) Prior Publication Data

US 2009/0196086 A1 Aug. 6, 2009

(51) Int. Cl.
*H01L 23/34* (2006.01)

(52) U.S. Cl. .............................. 257/723; 257/E21.506; 257/685; 257/690; 438/108

(58) Field of Classification Search .......... 257/E21.506, 257/E25.013, E25.018, 685, 686, 690, 691, 257/698, 723–725, 777; 438/108, 109; 361/760; 365/63; 326/37–41
See application file for complete search history.

(56) References Cited

U.S. PATENT DOCUMENTS

| | | | | | |
|---|---|---|---|---|---|
| 4,688,222 | A | * | 8/1987 | Blum | 714/732 |
| 5,023,689 | A | * | 6/1991 | Sugawara | 257/372 |
| 5,040,144 | A | | 8/1991 | Pelley et al. | |
| 5,678,020 | A | * | 10/1997 | Singh et al. | 711/100 |
| 5,848,264 | A | * | 12/1998 | Baird et al. | 703/28 |
| 5,867,704 | A | * | 2/1999 | Tanaka et al. | 718/105 |
| 5,983,023 | A | * | 11/1999 | Moriwaki et al. | 712/32 |
| 6,201,740 | B1 | * | 3/2001 | Seyyedy et al. | 365/189.19 |
| 6,246,112 | B1 | * | 6/2001 | Ball et al. | 257/690 |
| 6,415,424 | B1 | * | 7/2002 | Arimilli et al. | 716/8 |
| 6,427,191 | B1 | * | 7/2002 | Fu et al. | 711/131 |
| 6,627,985 | B2 | | 9/2003 | Huppenthal et al. | |
| 7,279,795 | B2 | | 10/2007 | Periaman et al. | |
| 7,281,092 | B2 | * | 10/2007 | Rajamony et al. | 711/122 |
| 7,556,442 | B2 | * | 7/2009 | Frantz et al. | 396/529 |
| 2004/0164334 | A1 | | 8/2004 | Masleid et al. | |
| 2006/0097815 | A1 | | 5/2006 | Grasso et al. | |

OTHER PUBLICATIONS

Bautista. Jerry: "Tera-scale Computing—the Role of Interconnects in Volume Compute platforms", International Interconnect Technology Conference, IEEE 2007: Jun. 4-6, 2007, pp. 187-189, IEEE.
"EMC-3D Consortium Created for the Development of Cost-Effective Through-Silicon-Via Interconnects"; http://www.semitool.com/pdf_files/1_EMC-3D_ODVERVIEW.PDF; Downloaded on Jan. 31, 2008, 4 pages.
Kim, Bioh; "EMC-3D Consortium Targets Cost-Effective TSV Interconnects"; http://www.semitool.com/pdf_files/1_SI_EMC3D_FEB2007.PDF; Semiconductor International; Feb. 1, 2007.
PCT Search Report and Written Opinion, PCT/US2009/030255, mailed Jun. 29, 2009.

* cited by examiner

*Primary Examiner*—Chris C Chu

(57) ABSTRACT

A processor/cache assembly has a processor die coupled to a cache die. The processor die has a plurality of processor units arranged in an array. There is a plurality of processor sets of contact pads on the processor units, one processor set for each processor unit. Similarly, the cache die has a plurality of cache units arranged in an array. There is a plurality of cache sets of contact pads on the cache die, one cache set for each cache unit. Each cache set is in contact with one corresponding processor set.

20 Claims, 3 Drawing Sheets

| PROCESSING UNIT 11 | PROCESSING UNIT 12 | PROCESSING UNIT 13 | PROCESSING UNIT 14 | PROCESSING UNIT 15 |
|---|---|---|---|---|
| PROCESSING UNIT 16 | PROCESSING UNIT 17 | PROCESSING UNIT 18 | PROCESSING UNIT 19 | PROCESSING UNIT 20 |
| PROCESSING UNIT 21 | PROCESSING UNIT 22 | PROCESSING UNIT 23 | PROCESSING UNIT 24 | PROCESSING UNIT 25 |
| PROCESSING UNIT 26 | PROCESSING UNIT 27 | PROCESSING UNIT 28 | PROCESSING UNIT 29 | PROCESSING UNIT 30 |
| PROCESSING UNIT 31 | PROCESSING UNIT 32 | PROCESSING UNIT 33 | PROCESSING UNIT 34 | PROCESSING UNIT 35 |

*FIG. 1*

| PROCESSING UNIT 11 | PROCESSING UNIT 12 | PROCESSING UNIT 13 | PROCESSING UNIT 14 | PROCESSING UNIT 15 |
|---|---|---|---|---|
| PROCESSING UNIT 16 | PROCESSING UNIT 17 | PROCESSING UNIT 18 | PROCESSING UNIT 19 | PROCESSING UNIT 20 |
| PROCESSING UNIT (P1) 21 | PROCESSING UNIT (P2) 22 | PROCESSING UNIT (P3) 23 | PROCESSING UNIT (P4) 24 | PROCESSING UNIT (P5) 25 |
| PROCESSING UNIT 26 | PROCESSING UNIT 27 | PROCESSING UNIT 28 | PROCESSING UNIT 29 | PROCESSING UNIT 30 |
| PROCESSING UNIT 31 | PROCESSING UNIT 32 | PROCESSING UNIT 33 | PROCESSING UNIT 34 | PROCESSING UNIT 35 |

*FIG. 2*

HIGH BANDWIDTH CACHE-TO-PROCESSING UNIT COMMUNICATION IN A MULTIPLE PROCESSOR/CACHE SYSTEM

BACKGROUND

1. Field

This disclosure relates generally to semiconductors, and more specifically, to processing operating speeds that exist in semiconductor packages having multiple die.

2. Related Art

It is well known to stack two or more semiconductor packages on top of each other to reduce footprint area. Others have also proposed stacking two or more semiconductor die on top of each other. Various solutions have been proposed for addressing problems associated with additional heat that is generated when two separate semiconductors are placed in close proximity with each other. The size of the semiconductors and their functions continue to limit the practical use of stacked semiconductors, as well as the ability to efficiently make electrical connections to multiple semiconductors in close proximity.

Commercial data processing systems typically utilize multiple cores or processing units. For example, it is common in the desktop processing environment for dual core processors to be efficiently used by splitting functions in a method that concurrently processes information. In U.S. Pat. No. 7,279,795 issued to Periaman et al. a stacked die semiconductor is disclosed in which one die is a multiple core processor die and a second die contains a shared memory for the multiple cores. The shared memory must therefore be made large to minimize the number of memory accesses to a main off-chip memory. The effective data communication bandwidth of such a configuration is lowered as compared to a single chip implementation in which each processor core has a memory and a memory control located on the same die. Efficiently addressing both the data communication bandwidth and the size or package footprint issues in multiple processing core systems remains problematic.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates in diagrammatic form a first semiconductor die having a plurality of separate processing units in accordance with a first embodiment;

FIG. 2 illustrates in diagrammatic form the first semiconductor die having a plurality of separate processing units in accordance with a second embodiment;

DETAILED DESCRIPTION

Figure 3:
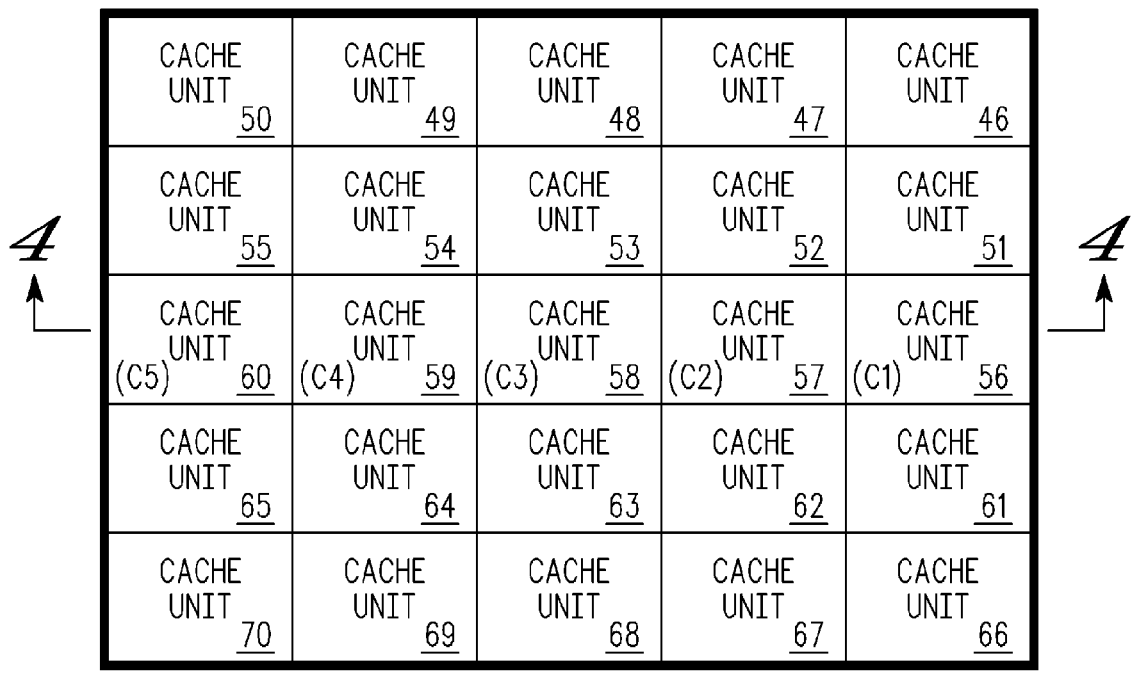
FIG. 3 illustrates in diagrammatic form a second semiconductor die having a plurality of semiconductor cache units, each correlated to a specific processing unit of the first semiconductor die.

Illustrated in FIG. 1 is a major surface of a processor die 9 having a plurality of individual and separate processing units 11-35 provided in an array having rows and columns. In other forms the processing units 11-35 may be placed in an array of geometric configurations other than rows and columns of processing units. Each of the processing units 11-35 is any type of a variety of data processors. For example, each of the processing units 11-35 may be a central processing unit (CPUs), a digital signal processor, a graphics-specific processor, a microcontroller unit (MCU), a communications processor or any other type of processing unit. Further, the processing units 11-35 may be the same type of processing unit or may vary between types of processing unit across the processor die 9. In the illustrated form there are five rows with each processing unit row having five columns. It should be understood that the illustrated embodiment is exemplary only and any number of X rows and Y columns of processing units may be implemented, where X and Y are integers of two or greater. In one form only four processing units are implemented. Additionally, it should be understood that the physical size or layout area of the processing units 11-35 does not necessarily need to be uniform as illustrated in FIG. 1. When functionally differing types of processing units are implemented, the circuit area consumed by each processing unit may differ. Further it should be understood that while rectangular shapes are provided for each of the processing units 11-35, other geometric shapes may be implemented. In the illustrated form it should be understood that there is provided some physical separation and interconnect between each of the processing units 11-35. However, the amount of die area required to provide this isolation is a limited amount of the total die and is therefore not illustrated. Additionally, it should be noted that substantially all of the area of processor die 9 is dedicated area for the processing units 11-35 and this embodiment is therefore very size efficient.

Illustrated in FIG. 2 is another embodiment wherein a major surface of a processor die 10 has both the processing units 11-35 and an external connection region 38 that is peripheral to the processing units 11-35. Each of the processing units 11-35 that have an external edge are adjoined by the external connection region 38. That would therefore be processing units 11-15, 16, 20, 21, 25, 26, 30 and 31-35. Within the external connection region 38 are a plurality of external contact pads 44 that are placed at predetermined locations for providing connections from external the processing units 11-35. For further reference, processing units 21-25 are also respectively labeled P1 through P5. In one form an external contact pad 40 is a rectangular-shaped pad for a wire bond connection to circuitry external to the processor die 10. Similarly, an external contact pad 42 is a circular-shaped pad for placement of a conductive bump such as a solder bump. In this embodiment the external connection region 38 is an area of the die 10 where electrical connection from external to die 10 is made. Underlying the contact pads within the external connection region 38 are conductive routing (not visible from the view of FIG. 2) that connects the contact pads to predetermined circuitry within the die 10. The contact pads communicate power, data, control signals and address signals and provide a way to obtain external access to the processor die 10.

Illustrated in FIG. 3 is a top view of a cache die 45 having a plurality or an array of cache units. Each of the cache units 46-70 is a semiconductor cache (i.e. memory). Each of the cache units 46-70 is any type of cache memory. For example, each of the processing units 46-70 may be static random access memory (SRAM), FLASH memory, magnetoresistive random access memory (MRAM), dynamic random access memory (DRAM) or any other type of memory. The cache units 46-70 may be the same type of memory unit or may vary. In the illustrated form there are five rows with each cache unit row having five columns. It should be noted that the illustrated embodiment has the same number of rows and columns of cache units as processing units so that each processing unit is correlated to an exclusive and separate cache unit.

Additionally, it should be understood that the physical size or layout area of the cache units 46-70 is intentionally correlated to a predetermined different processing unit of processor die 9 of FIG. 1 or processor die 10 of FIG. 2. In this correlation, each cache unit of processor die 9 or processor die 10 is for connection to a specific designated one of the cache units of cache die 45. As a result, each processing unit in a first die has a dedicated cache unit in a second die. The circuit area consumed by each cache unit may therefore differ. Further it should be understood that while rectangular shapes are provided for each of the cache units 46-70, other geometric shapes may be implemented. In the illustrated form it should be understood that there may be provided some physical separation and interconnect between each of the cache units 46-70. However, the amount of die area required to provide this isolation is a limited amount of the total die and is therefore not illustrated. Additionally, it should be noted that substantially all of the area of processor die 9 is dedicated area for the cache units 46-70 and this embodiment is therefore also very size efficient. In the FIG. 3 illustration, the various interconnects to each cache unit are not shown in the top view shown.

Figure 4:
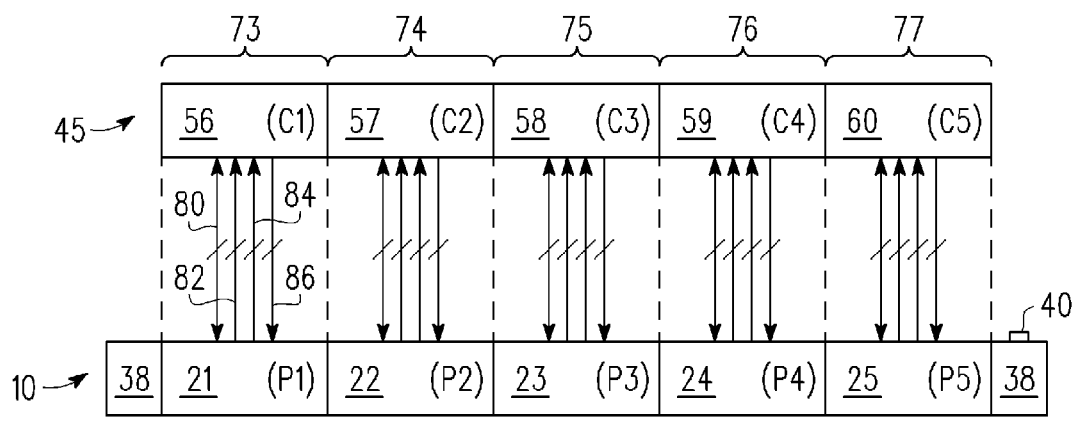
FIG. 4 illustrates in cross-sectional form the physical attributes of the first semiconductor die of FIG. 2 when joined with the second semiconductor die of FIG. 3 via associated functional connections.

To further understand the connections associated with each of the cache units of FIG. 3, there is illustrated in FIG. 4 a cross-section of the processor die 10 and the cache die 45 taken along line 4-4 of each of FIG. 2 and FIG. 3, respectively. The connection of processor die 10 and cache die 45 as illustrated in FIG. 4 forms a multiple processor/cache assembly wherein the processor die 9 is directly connected to the cache die 45. In the illustrated form the processor die 10 aligns in a predetermined alignment with the cache die 45 to form regions designated as processor/cache 73, processor/cache 74, processor/cache 75, processor/cache 76 and processor/cache 77. Within each of these regions, a processor is coterminous with a corresponding cache. Each region is coterminous or coextensive meaning that they have substantially the same or coincident boundaries. Each of these processor/cache combinations are connected by four multiple-conductor buses as illustrated in FIG. 4. The number of buses that are used is application dependent and other forms may use less or more buses than illustrated. Cache unit 56 is connected to the processing unit 21 via a data bus 80, an address bus 82, a control bus 84 and a status bus 86. The data bus 80 is bidirectional. The address bus 82 is unidirectional with the processing unit 21 providing memory addresses directly to the cache unit 56. The control bus 84 is also unidirectional wherein the processing unit 21 provides control information to the cache unit 56 to control memory accesses to the cache unit 56. In some forms the control bus 84 may be bidirectional. The status bus 86 is also unidirectional wherein the cache unit 56 provides status information to the processing unit 21. The buses which are discussed herein may be physically implemented with any of a variety of physical structures. In one form conductive bumps, such as solder bumps, may be used to form the processor unit/cache unit connections when the processor die 10 is directly attached to the cache die 45. In other forms conductive contact pads may be used on the surface of each of processor die 10 and cache die 45 so that when they are connected together a processing unit is directly connected to a cache unit. The contacts are therefore direct and vertical in direction. In this form the direct contacts are short and therefore approximate the electrical properties of a multiple layer single die. Therefore, capacitance and inductance associated with the connectors between a processor and a cache are minimized which improves performance parameters including speed, area and power.

In the illustrated form of the multiple processor/cache assembly 72, the processor die 10 extends wider than the cache die 45 to expose the external connection region 38. As illustrated in FIG. 4, the external contact pad 40 is provided for future contact to the multiple processor/cache assembly. Contact to the external contact pad 40 may be made by conductive bump, wire bond or other interconnect methods.

Figure 5:
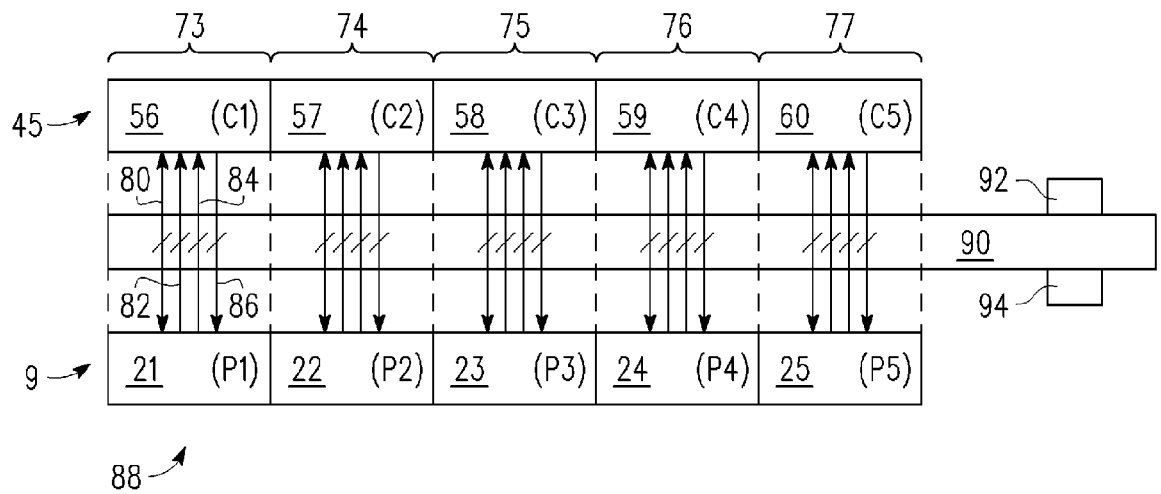
FIG. 5 illustrates in cross-sectional form the physical attributes of the first semiconductor die of FIG. 1 when joined with the second semiconductor die of FIG. 3 via an interposer and associated functional connections.

Illustrated in FIG. 5 is another embodiment wherein an interposer 90 is provided for separating the processor die 9 from the cache die 45 to form a multiple processor/cache assembly 88. In this form the processor die 9 and the cache die 45 are implemented with substantially the same width. External contact to the multiple processor/cache assembly 88 is made by extending the interposer 90 on at least one side beyond the widths of the processor die 9 and the cache die 45. In FIG. 5 interposer 90 is extended to the right. An external contact 92 and an external contact 94 are positioned on opposing sides of the exposed portion of interposer 90. Electrical contact to the exposed contacts of the interposer 90 may be made by various methods such as connecting the interposer 90 in a clip contact which fits around the contacts on both sides of interposer 90. Alternatively a socket with a recess could be used. In yet another form, the interposer 90 may be fitted into a contact hole in a substrate. In other forms wire bonds or solder ball connections may be made to the external contacts of the interposer 90. The interposer 90 may be formed of any of various materials. In one form interposer 90 is silicon. Other suitable materials include heat conducting ceramic or flexible organic film. The interposer 90 has a plurality of vias or openings for placement of conductive material to implement the conductors of the buses, such as data bus 80, address bus 82, control bus 84 and status bus 86. As a result of the physical layout of the cache die 45 relative to the processor die 9, the cache unit 60 or C5 is directly connected to the processing unit 25 or P5. Similarly, unit C4 is connected directly to unit P4. Unit C3 is connected directly to unit P3, and unit C2 is connected directly to unit P2. The unit C1 is connected directly to unit P1.

It should be understood that effective heat sinking techniques may be used in connection with the multiple processor/cache assembly 88 of FIGS. 4 and 5. For example, on the exposed sides or surfaces of the processor die 9 and 10 and the cache die 45, various heat removing structures and materials may be placed. Additionally, depending upon the material used for the interposer 90 some heat transfer away from the multiple processing cores and caches may be obtained.

Figure 6:
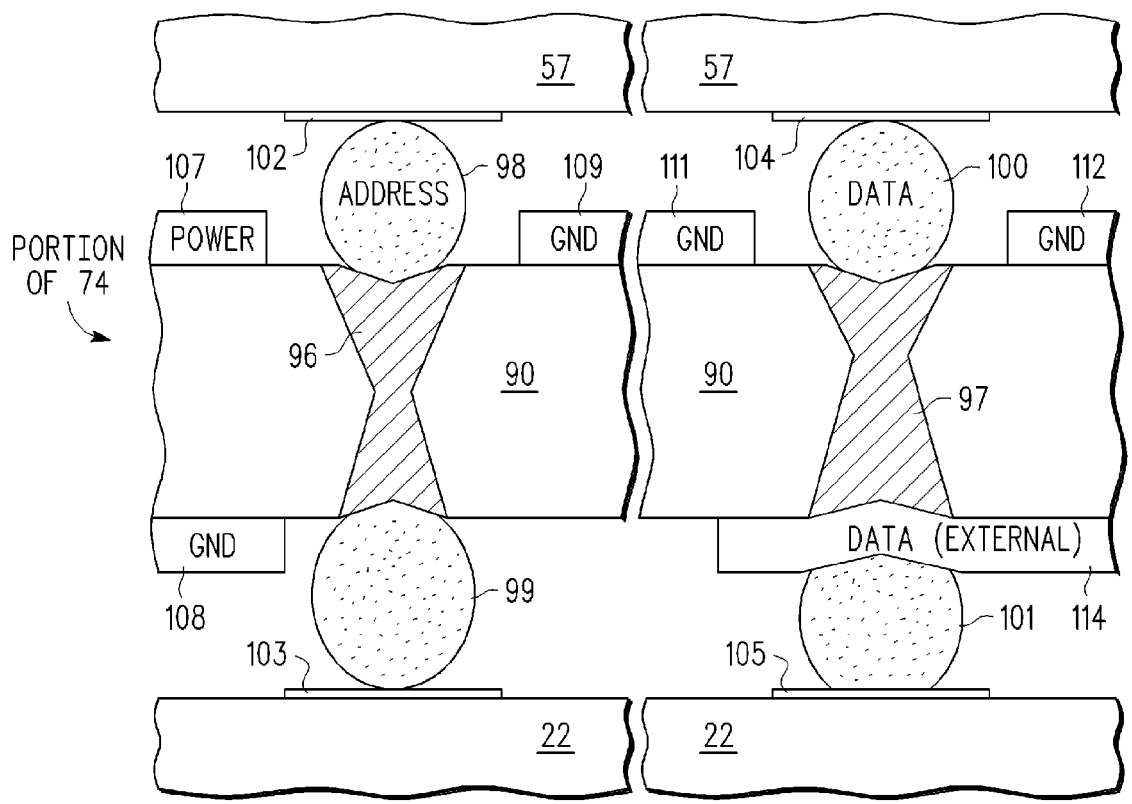
FIG. 6 illustrates in cross-sectional form the physical attributes of interposer of FIG. 5 when connecting a portion of the first semiconductor die to the second semiconductor die.

Illustrated in FIG. 6 is a detail of a portion of the processor/cache 74 of FIG. 5. Connection from the cache die 45 to the processor die 9 via the interposer 90 that is positioned between the two die is illustrated in detail. The cache unit 57 overlies and connects to the processing unit 22 in FIG. 6. Only a small portion of each of the cache unit 57 and the processing unit 22 is shown as designated by a break between two portions of the processor/cache 74. An address conductor is illustrated on the left and a data conductor is illustrated on the right. The address conductor uses an opening or via in the interposer 90 identified as conductive via 96. It should be understood that the opening of conductive via 96 is filled with a conductive material such as metal or other electrical conductors. A conductive bump 98 overlies the conductive via 96 and makes contact to the cache unit 57 by contacting a contact pad 102. A conductive bump 99 underlies the conductive via 96 and makes contact to the processing unit 22 via a contact pad 103. Attached to the interposer 90 are various conductive traces for carrying power supply signals and other signals such as data. The data conductor is implemented by an opening or via in the interposer 90 that is identified as conductive via 97. Any conductive material may be used to implement the conductive vias. A conductive bump 100 overlies the conductive via 97 and makes contact to the cache unit 57 by contacting a contact pad 104. A data trace 114 for external connection underlies the conductive via 97 and makes contact to the processing unit 22 via a conductive bump 101 at a contact pad 105. It should be understood and noted that an air gap may exist between the interposer 90 and each of the cache die 45 and the processor die 9 adjacent the conductive bump connections. In other forms the two die may be sufficiently compressed together so that the air gap is very small. In another embodiment a fill material (not shown) may be used to fill the air gap. In the illustrated form a very direct and short electrical path therefore exists between a processing unit on a first die and a correlated dedicated cache for that processing unit on a second die that is either above or below the first die. The structures provided herein implement a multi-processor array that has a specific, dedicated cache memory for each processor efficiently connected. The direct contact between a cache memory and a correlated processor permits customization of the cache regarding type, size, speed, etc. rather than having a common cache memory for multiple processors that likely operate with differing parameters. The appropriate matching of cache memory speed with an associated processor permits efficient customization of a processing system. It should be further understood that in another implementation one or more of the cache memories on the cache die 45 may be implemented as a dual port cache memory and have first and second input ports respectively connected to two different processing units on processor die 10. It should also be noted that the conductive bumps 98-101 may be initially formed on the interposer 90 rather than on the processor die 10 and the cache die 45. The placement of the conductive bumps initially on the interposer 90 avoids potential yield issues associated with bumping the die. Any defect associated with the bumping process of a die is much more expensive than with the bumping of an interposer.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

By now it should be appreciated that there has been provided a high bandwidth communication system between a multiple processor (multi-core) array and a cache memory. Using vertical connections with an interposer between a physically matched cache memory provides efficient area use and high bandwidth due to the short and direct connections. Each processor or core in an array within a die has an overlayed cache memory that is physically aligned to directly connect in a stacked die combination. The various embodiments described herein implement a pair of matched semiconductor die with a one-to-one alignment of each correlated processor/cache memory pair. As a result, very large cache memories may be implemented physically adjacent or next to a processor core without increasing the die size of the processor. By implementing large storage cache memories, the requirement to use an external main system memory is reduced and the system efficiency is dramatically improved. Lower bandwidth requirements to the main memory therefore result.

In one form there is herein provided a processor/cache assembly having a first semiconductor die having an array of processing units. Each processing unit of the array of processing units has a set of processor contact pads. The processor contact pads are conductive pads on a surface of the first semiconductor die. Each set of processor contact pads is unique from the set of processor contact pads of all of the other processing units of the array of processing units. Each set of the processor contact pads includes a first subset of processor contact pads for address signals and a second subset of processor contact pads for data signals. A second semiconductor die has an array of cache units. Each cache unit of the array of cache units has a set of cache contact pads. The cache contact pads are conductive pads on a surface external of the second semiconductor die. Each set of cache contact pads is unique from the set of cache contact pads of all of the other cache units of the array of cache units. Each set of the external contact pads includes a first subset of cache contact pads for address signals and a second subset of cache contact pads for data signals. The first subset of cache contact pads of each cache unit is connected to the first subset of processor contact pads of a unique one of the processor units. The second subset of cache contact pads of each cache unit is connected to the second subset of processor contact pads of the processor unit to which its first subset of cache contact pads is connected. In one form the first semiconductor die has a major surface and the processor contact pads are on the major surface of the first semiconductor die. The second semiconductor has a major surface and the cache contact pads are on the major surface of the second semiconductor die. The major surface of the first semiconductor die faces the major surface of the second semiconductor die. In another form the processor contact pads are directly connected to the cache contact pads through conductive bumps. In yet another form the first semiconductor die has a greater surface area than the second semiconductor die. In yet another form the first semiconductor die has external contact pads along a periphery of the first semiconductor die for making external connections from the first semiconductor die. In another form an interposer is between the major surfaces for connecting the processor contact pads to the cache contact pads. In yet another form the interposer has traces for carrying power to at least one of a group consisting of the first semiconductor die and the second semiconductor die. In another form the interposer extends beyond an outer boundary of the first semiconductor die and the second semiconductor die. In another form the processor units have a first area and the cache units have a second area, wherein the first area and the second area are substantially the same. In yet another form the outer boundaries of the processor units and the cache units are coterminous. In another form each of the processing units is the same shape and size as the other processing units. In another form the array of processing units has a first geometric shape and the array of cache units has a second geometric shape that is a mirror image of the first geometric shape.

In yet another form there is provided a method of making a processor/cache assembly. A processor die is formed having an array of processor units being in a first arrangement and having a first plurality of contact pads in a second arrangement. A cache die is formed having an array of cache units being in a third arrangement and having a second plurality of contact pads in a fourth arrangement. The third arrangement is a mirror image of the first arrangement, and the fourth arrangement is a mirror image of the second arrangement. The first die is contacted to the second die. In one form forming the processor die is implemented with the first plurality of contact pads having a plurality of processor sets of contact pads wherein each processor set is unique to one of the processor units and has a first subset of contact pads for carrying an address. Forming the cache die is implemented by a second plurality of contact pads having a plurality of cache sets of contact pads wherein each cache set is unique to one of the cache units and has a second subset of contact pads for carrying an address. In another form contacting the first die to the second die causes each of the processor units to be coterminous with a unique one of the cache units. In another form the contacting directly connects the first plurality of contacts to the second plurality of contacts through a plurality of solder bumps. In another form the contacting is implemented by providing an interposer and connecting the first and second die to the interposer.

In another form there is provided a processor/cache assembly having a processor die having first, second, third, and fourth processor units arranged in an array of processor units. First, second, third, and fourth sets of processor contact pads are on a first major surface of the processor die, wherein the first, second, third, and fourth sets of processor contact pads are for carrying addresses from the first, second, third, and fourth processor units, respectively. A cache die has first, second, third, and fourth cache units arranged in an array of cache units. First, second, third, and fourth sets of cache contact pads are on a first major surface of the cache die, wherein the first, second, third, and fourth sets of cache contact pads are for receiving addresses from the first, second, third, and fourth processor units, respectively, for the use of the first, second, third, and fourth cache units, respectively. In another form fifth, sixth, seventh, and eighth sets of processor contact pads are on the first major surface of the processor die, wherein the fifth, sixth, seventh, and eighth sets of processor contact pads are for carrying data to and from the first, second, third, and fourth processor units, respectively. Fifth, sixth, seventh, and eighth sets of cache contact pads are on the first major surface of the cache die, wherein the fifth, sixth, seventh, and eighth sets of cache contact pads are for carrying data to and from the first, second, third, and fourth cache units, respectively. In yet another form the first, second, third, and fourth cache units are caches dedicated to use by the first, second, third, and fourth processor units, respectively.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, some systems that implement the disclosed structures may place the processing die in between two memory die wherein separate memory die are both on top and below the processing die. As multiple core systems proliferate any number of processing units may be implemented on a single die. Similarly, a single processing unit may have multiple sub-units of processing units. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, the multiple processor/memory cache systems described herein are computer systems such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. For example, other forms of conductive contacts besides conductive bumps may be used. In one form conductive pads on both the semiconductor die and the interposer may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A processor/cache assembly, comprising:
   a first semiconductor die having an array of processing units, wherein:
      each processing unit of the array of processing units has a set of processor contact pads;
      the set of processor contact pads are conductive pads on a surface of the first semiconductor die;
      each set of processor contact pads is unique from the set of processor contact pads of all other processing units of the array of processing units; and
      each set of the processor contact pads includes a first subset of processor contact pads for address signals and a second subset of processor contact pads for data signals; and
   a second semiconductor die having an array of cache units, wherein:
      each cache unit of the array of cache units has a set of cache contact pads;
      the set of cache contact pads are conductive pads on a surface external of the second semiconductor die;
      each set of cache contact pads is unique from the set of cache contact pads of all other cache units of the array of cache units;
      each set of the external contact pads includes a first subset of cache contact pads for address signals and a second subset of cache contact pads for data signals;
      the first subset of cache contact pads of each cache unit is connected to the first subset of processor contact pads of a unique one of the processor units; and
      the second subset of cache contact pads of each cache unit is connected to the second subset of processor contact pads of the processor unit to which its first subset of cache contact pads is connected.

2. The processor/cache assembly of claim 1, wherein:
   the first semiconductor die has a major surface;
   the processor contact pads are on the major surface of the first semiconductor die;
   the second semiconductor die has a major surface;
   the cache contact pads are on the major surface of the second semiconductor die; and
   the major surface of the first semiconductor die faces the major surface of the second semiconductor die.

3. The processor/cache assembly of claim 2, wherein the processor contact pads are directly connected to the cache contact pads through conductive bumps.

4. The processor/cache assembly of claim 3, wherein the first semiconductor die is further characterized as having a greater surface area than the second semiconductor die.

5. The processor/cache assembly of claim 4, wherein the first semiconductor die has external contact pads along a periphery of the first semiconductor die for making external connections from the first semiconductor die.

6. The processor/cache assembly of claim 2, further comprising an interposer between each major surface of the first semiconductor die and the second semiconductor die for connecting the processor contact pads to the cache contact pads.

7. The processor/cache assembly of claim 6, wherein the interposer has traces for carrying power to at least one of a group consisting of the first semiconductor die and the second semiconductor die.

8. The processor/cache assembly of claim 7, wherein the interposer extends beyond an outer boundary of the first semiconductor die and the second semiconductor die.

9. The processor/cache assembly of claim 1, wherein the processing units have a first area and the cache units have a second area, wherein the first area and the second area are substantially the same.

10. The processor/cache assembly of claim 9, wherein outer boundaries of the processing units and the cache units are coterminous.

11. The processor/cache assembly of claim 1, wherein each of the processing units is the same shape and size as all other processing units.

12. The processor/cache assembly of claim 1, wherein the array of processing units has a first geometric shape and the array of cache units has a second geometric shape that is a mirror image of the first geometric shape.

13. A processor/cache assembly, comprising:
   a processor die having first, second, third, and fourth processor units arranged in an array of processor units;
   first, second, third, and fourth sets of processor contact pads on a first major surface of the processor die, wherein the first, second, third, and fourth sets of processor contact pads are for carrying addresses from the first, second, third, and fourth processor units, respectively;

a cache die having first, second, third, and fourth cache units arranged in an array of cache units;

first, second, third, and fourth sets of cache contact pads on a first major surface of the cache die, wherein the first, second, third, and fourth sets of cache contact pads are for receiving addresses from the first, second, third, and fourth processor units, respectively, for the use of the first, second, third, and fourth cache units, respectively.

14. The processor/cache assembly of claim 13, further comprising:

fifth, sixth, seventh, and eighth sets of processor contact pads on the first major surface of the processor die, wherein the fifth, sixth, seventh, and eighth sets of processor contact pads are for carrying data to and from the first, second, third, and fourth processor units, respectively; and fifth, sixth, seventh, and eighth sets of cache contact pads on the first major surface of the cache die, wherein the fifth, sixth, seventh, and eighth sets of cache contact pads are for carrying data to and from the first, second, third, and fourth cache units, respectively.

15. The processor/cache assembly of claim 13, wherein the first, second, third, and fourth cache units are caches dedicated to use by the first, second, third, and fourth processor units, respectively.

16. A processor/cache assembly, comprising:

a first semiconductor die having an array of processing units, wherein:

each processing unit of the array of processing units has a set of processor contact pads;

the set of processor contact pads are conductive pads on a surface of the first semiconductor die;

each set of processor contact pads is unique from the set of processor contact pads of all other processing units of the array of processing units; and each set of the processor contact pads includes a first subset of processor contact pads for address signals and a second subset of processor contact pads for data signals;

a second semiconductor die having an array of cache units, wherein:

each cache unit of the array of cache units has a set of cache contact pads;

the set of cache contact pads are conductive pads on a surface external of the second semiconductor die;

each set of cache contact pads is unique from the set of cache contact pads of all other cache units of the array of cache units;

each set of the external contact pads includes a first subset of cache contact pads for address signals and a second subset of cache contact pads for data signals;

the first subset of cache contact pads of each cache unit is connected to the first subset of processor contact pads of a unique one of the processor units; and the second subset of cache contact pads of each cache unit is connected to the second subset of processor contact pads of the processor unit to which its first subset of cache contact pads is connected; and an interposer between adjoining surfaces of the first die and the second die for connecting processor contact pads of at least one processing unit of the array of processing units to correlated cache contact pads of a correlated cache unit of the array of cache units.

17. The processor/cache assembly of claim 16, wherein the interposer has traces for carrying power to at least one of a group consisting of the first semiconductor die and the second semiconductor die.

18. The processor/cache assembly of claim 17, wherein the interposer extends beyond an outer boundary of the first semiconductor die and the second semiconductor die.

19. The processor/cache assembly of claim 16, wherein the processing units have a first area and the cache units have a second area, wherein the first area and the second area are substantially the same.

20. The processor/cache assembly of claim 16, wherein the array of processing units has a first geometric shape and the array of cache units has a second geometric shape that is a minor image of the first geometric shape.

* * * * *